United States Patent
Counts et al.

(10) Patent No.: US 10,682,539 B2
(45) Date of Patent: Jun. 16, 2020

(54) FIRE SUPPRESSION SYSTEM MODULES AND METHODS OF SEALING

(71) Applicant: Tyco Fire Products LP, Lansdale, PA (US)

(72) Inventors: Brian Lee Counts, Menominee, MI (US); Chad Lee Ryczek, Oconto Falls, WI (US); Marvin B. Fernstrum, Menominee, MI (US)

(73) Assignee: Tyco Fire Products LP, Lansdale, PA (US)

( * ) Notice: Subject to any disclaimer, the term of this patent is extended or adjusted under 35 U.S.C. 154(b) by 0 days.

(21) Appl. No.: 16/091,956

(22) PCT Filed: Apr. 6, 2017

(86) PCT No.: PCT/US2017/026355
§ 371 (c)(1),
(2) Date: Oct. 5, 2018

(87) PCT Pub. No.: WO2017/177000
PCT Pub. Date: Oct. 12, 2017

(65) Prior Publication Data
US 2019/0160316 A1 May 30, 2019

Related U.S. Application Data

(60) Provisional application No. 62/320,413, filed on Apr. 8, 2016.

(51) Int. Cl.
*A62C 37/08* (2006.01)
*A62C 99/00* (2010.01)
(Continued)

(52) U.S. Cl.
CPC ............ *A62C 37/08* (2013.01); *A62C 99/009* (2013.01); *G08B 17/113* (2013.01);
(Continued)

(58) Field of Classification Search
None
See application file for complete search history.

(56) References Cited

U.S. PATENT DOCUMENTS 5,847,661 A * 12/1998 Ricci ................... G01S 13/931
340/902
6,606,897 B1 8/2003 Koyano et al.
(Continued)

FOREIGN PATENT DOCUMENTS

| DE | 20 2010 016 193 | 3/2011 |
| WO | WO-2014/047579 A1 | 3/2014 |
| WO | WO-2015/153714 | 10/2015 |

OTHER PUBLICATIONS

International Search Report and Written Opinion for International Application No. PCT/US2017/026355, dated Aug. 29, 2017, 15 pages.

*Primary Examiner* — Xanthia C Cunningham
(74) *Attorney, Agent, or Firm* — Foley & Lardner LLP

(57) ABSTRACT

Fire suppression systems (10) include modules (14x) interconnected with a centralized controller (12). The modules (14x) are configured, assembled and sealed for system operation in harsh environments. Modules of the system include a printed circuit board (PCB, 32, 132), a microprocessor (34), and an operative component (36) assembled within a housing (30, 130). A gasket member (38) is disposed about the component to form a seal about the component. Operative components may include fire detection elements (14x, 50) or an LCD screen (36, 236). Modules of the system can include an encapsulant compound for filling a void between the housing inner surface and the printed circuit board. Modules of the system can include a sealed chamber with a port to interface a computer device. A power module of the system includes a sealed housing with con-
(Continued)

nectors positioned to protect against moisture and debris and an isolating switch to permit maintenance of the system.

19 Claims, 14 Drawing Sheets

(51) Int. Cl.
    *G08B 17/113*     (2006.01)
    *H05K 5/00*     (2006.01)
    *H05K 5/02*     (2006.01)

(52) U.S. Cl.
    CPC ......... *H05K 5/0008* (2013.01); *H05K 5/0017* (2013.01); *H05K 5/0247* (2013.01)

(56) References Cited

U.S. PATENT DOCUMENTS

| | | | | |
|---|---|---|---|---|
| 2008/0004904 A1* | 1/2008 | Tran | ............... | A61B 5/0006 705/2 |
| 2011/0014501 A1* | 1/2011 | Scheucher | ............... | B60K 1/04 429/7 |
| 2011/0255250 A1* | 10/2011 | Dinh | ............... | G03B 15/03 361/749 |
| 2015/0105687 A1* | 4/2015 | Abreu | ............... | A61B 5/01 600/549 |
| 2015/0280517 A1* | 10/2015 | Ekstrom | ............... | H01H 21/12 173/170 |

* cited by examiner

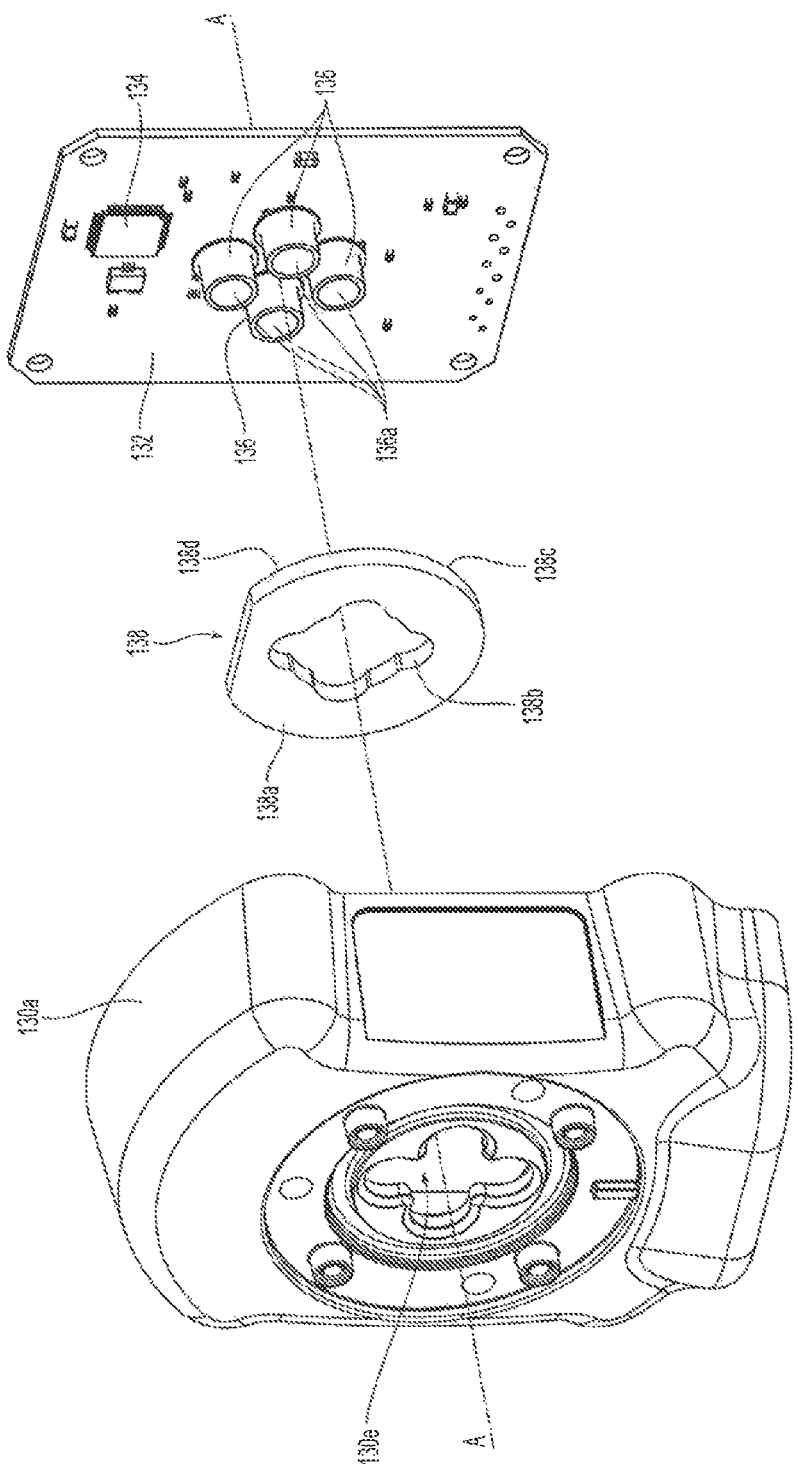

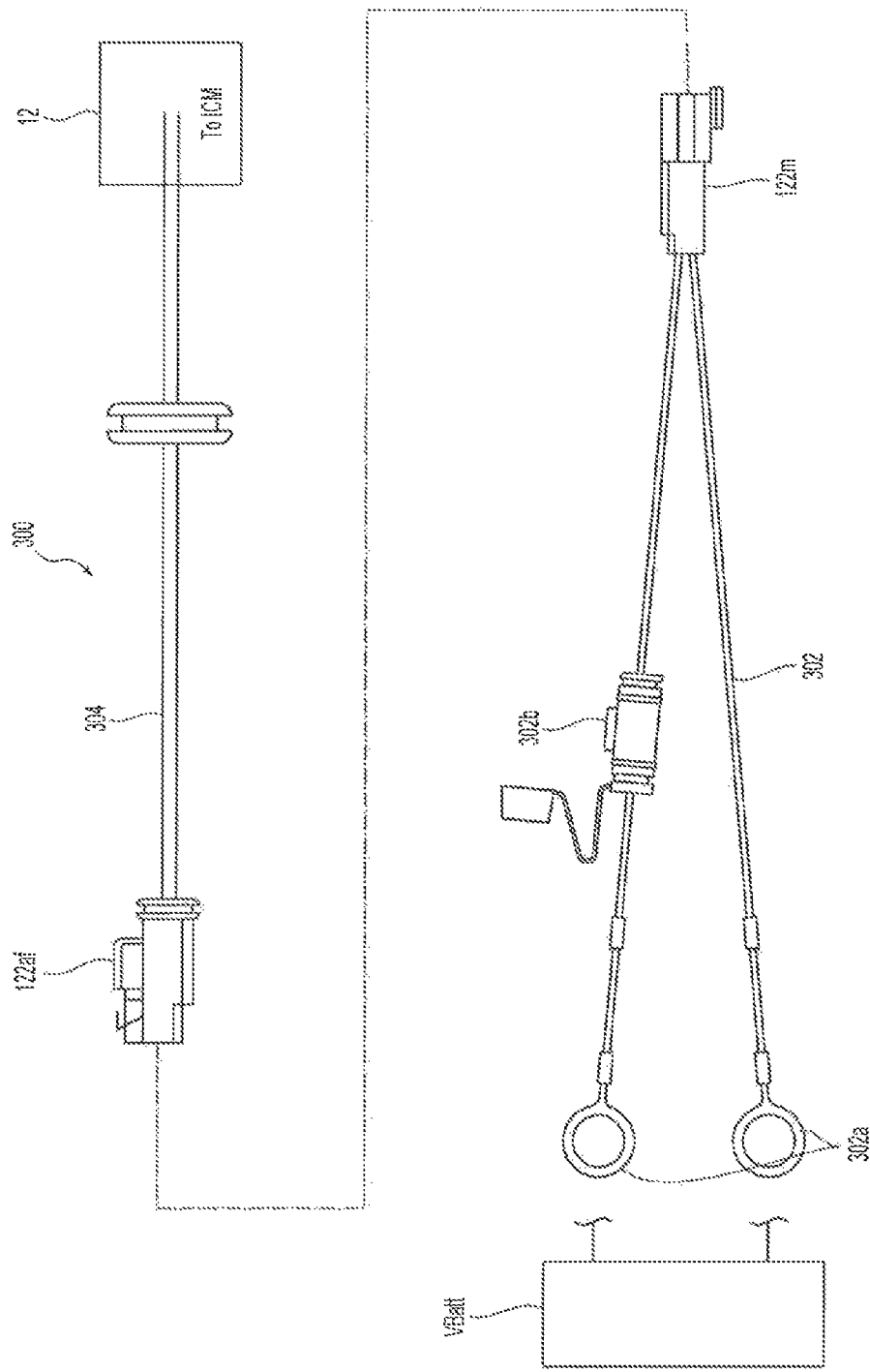

FIRE SUPPRESSION SYSTEM MODULES AND METHODS OF SEALING

PRIORITY CLAIM & INCORPORATION BY REFERENCE

This application is a National Stage Application of PCT/US2017/026355 filed Apr. 6, 2017, which claims the benefit of and priority to U.S. Provisional Patent Application No. 62/320,413, filed Apr. 8, 2016, both of which are incorporated by reference in their entirety.

TECHNICAL FIELD

This invention relates generally to fire suppression systems for the protection of large machinery, equipment or mobile equipment and more particularly to modular components of the fire suppression systems and their assembly.

BACKGROUND OF THE INVENTION

A fire suppression system for vehicles is shown in international patent application publication in WO 2014/047579. The system shown therein includes components such as user interface display devices and fire detection devices that are connected to a centralized controller. Such a fire suppression system can be installed in vehicles such as large, off-road type construction and mining equipment, which can operate in harsh environments that may expose the components of the fire suppression system to water, dust, oils, extreme temperatures and/or vibrations. In order to maintain system operation in such harsh environments, it is desirable for system components to be protected against moisture, debris and or shock.

DISCLOSURE OF THE INVENTION

Preferred embodiments of a fire suppression system include a centralized controller and a plurality of modules interconnected with the centralized controller. In order to protect and maintain system operation, it is desirable for system components to be configured, assembled and/or sealed to protect against the elements of harsh operating environments and/or facilitate system maintenance. Preferred modules of the system include a housing, a printed circuit board disposed within the housing, a microprocessor mounted to the printed circuit board, a component coupled to the microprocessor in which the component has an operative surface. A gasket member is disposed about the component in which the gasket has a gasket face to form a seal about the operative surface. Preferred embodiments of the module include components for detecting a fire, releasing fire suppressant or providing a user interface. In another preferred aspect, the housing has an inner surface and further includes an encapsulant compound filling a void between the housing inner surface and the printed circuit board. Preferred embodiments of the module have a sealing rating of at least IP67.

In another preferred embodiment of the fire suppression system, the system includes a centralized controller; and a module interconnected with the centralized controller. The module preferably includes a housing having a chamber with a chamber floor and a chamber wall. A port is preferably disposed along the chamber floor to interface a computer device. A cover plate is secured to the housing for covering the chamber. A post having a first end and a second end is preferably centered on the cover plate with a neck formed between the first and second end. The post is preferably disposed in the chamber with the second end of the post disposed over the port; and a gasket disposed about the neck portion. The gasket forms a seal with the chamber wall.

In yet another embodiment of a fire suppression system, the system includes a central controller having a case with the central controller disposed therein, and a plurality of connectors for connection to a plurality of modules and an external power source of the system. The plurality of modules include a battery back-up power module integrated with the central controller to power the plurality of modules. The preferred battery back-up power module includes a housing with at least one battery disposed therein. The housing has a base, and a plurality of walls extending from the base to form an edge circumscribed about a central axis to define an opening of the housing with the central controller case disposed over the opening. A seal is formed between the case and the housing. The case is preferably disposed over the edge to form an overhang, with the plurality of connectors disposed along the overhang. In a preferred aspect, the central controller is connected to a module for signaling automatic release of fire suppressant upon determination and detection of a fire by the central controller. The system further preferably includes a sealed isolation switch coupled with the central controller to disable the automatic release signaling so that the system can be service and maintained.

BRIEF DESCRIPTION OF THE DRAWINGS

The accompanying drawings, which are incorporated herein and constitute part of this specification, illustrate exemplary embodiments of the invention, and, together with the general description given above and the detailed description and attachments given below, serve to explain the features of the invention.

DETAILED DESCRIPTION OF THE PREFERRED EMBODIMENTS

Figure 1:
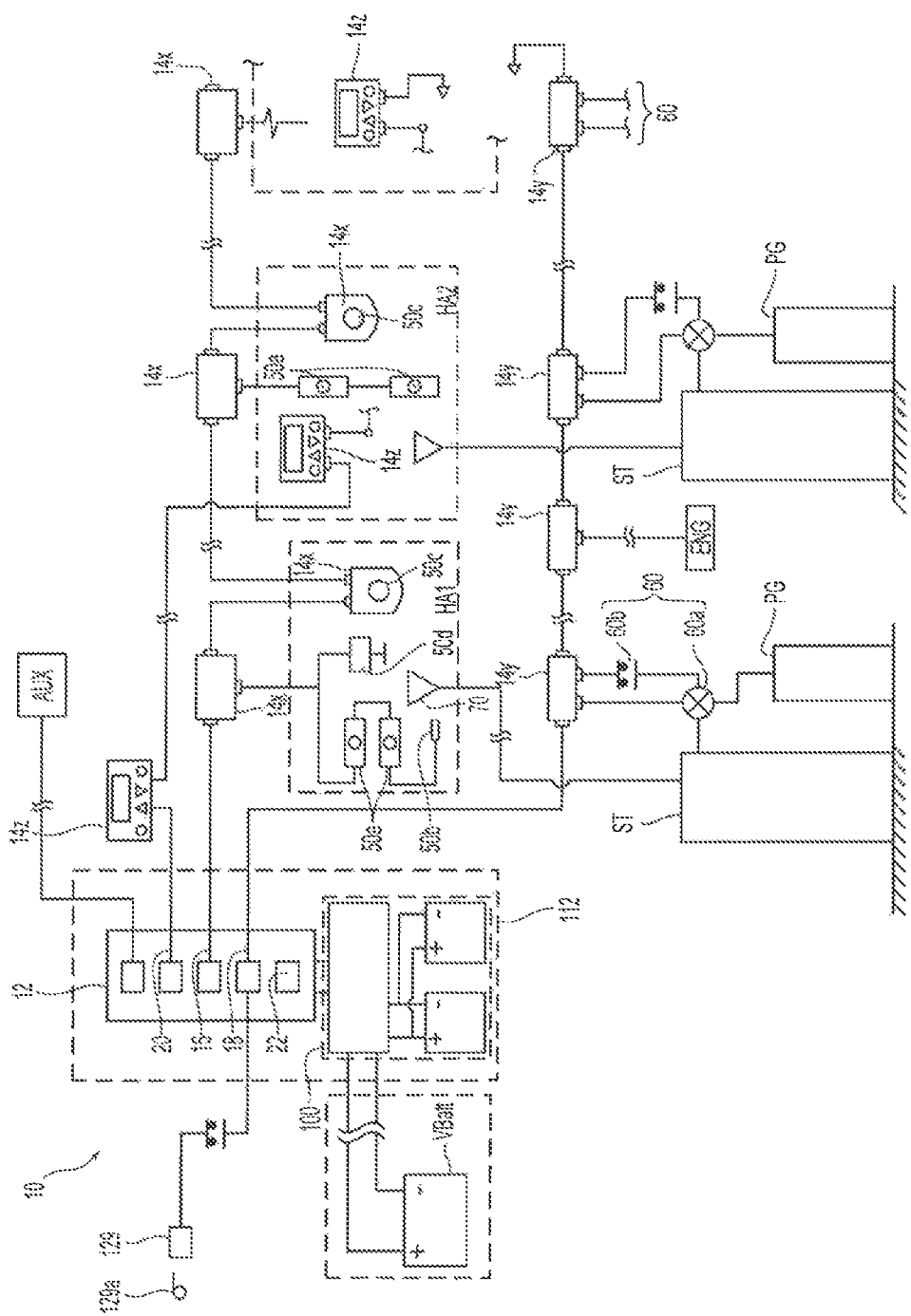
FIG. 1 is a schematic illustration of one embodiment of a fire suppression system.

FIG. 1 is a schematic illustration of a preferred embodiment of a fire protection system 10 that preferably provides for continuous monitoring and protection of one or more hazard areas HA. Exemplary hazard area(s) HA protected by the system 10 can include and are not limited to large industrial equipment, machinery or mobile equipment such as for example, generator sets, air compressors, drill rigs, tunnel boring machines, hydraulic excavators, haul trucks, wheeled loaders, dozers and graders, etc. and the associated areas such as for example, engine compartments, wheel wells, hydraulic equipment or storage areas for combustible materials. The system 10 is modular with modules interconnected with a central controller. The modules provide a specific or selectively addressable interface between system components and the central controller. Generally, the modules of the system are one of the following type: a detection module, a release or relay module, or a user interface module. The system 10 and its central controller monitor the one or more hazard areas HA through the detection modules and associated fire detection sensors to detect a fire. If a fire has been detected and identified by the central controller, the central controller addresses the fire through the release modules by operating one or more fluid control assemblies to release a suppressant and distribute the suppressant through one or more nozzles or distribution devices located in the hazard areas HA to preferably suppress the fire. The user interface modules provide owners and operators with an interface to program, update and access the system 10 for its operation, control and historical and/or real-time monitoring.

For the preferred embodiments of the system 10 described herein, the centralized controller can address or communicate with the modules of the system individually, selectively, in groups or globally in order to carry out desired fire protection monitoring, response, reporting and/or programming. The modules of a particular type or function are preferably grouped together and interconnected with one another and the central controller to form a data bus for carrying out one of the centralized functions, such as for example, detection, system response or user operations. Given the harsh environments and conditions in which the system 10 may be installed, such as for example, quarry operations which can be water-soaked, dusty, extremely cold or hot, and subject to large shocks and/or vibrations, it is desirable that the modules be appropriately sealed to withstand the harsh conditions.

Shown in FIG. 1 is a schematic view of a preferred embodiment of a fire suppression system 10 for the protection of one or more hazard areas HA1, HA2 . . . HAn (collectively HA). The system 10 includes a centralized controller 12 and a plurality of modules 14x, 14y, 14z interconnected with one another to provide for a detection data bus 16, a release data bus 18, and a user interface data bus 20 for centralized fire detection, response and/or system reporting. For the preferred system 10, the modules 14x of the detection bus 16 interconnect the central controller 12 with one or more fire detection devices 50, such as for example, spot thermal detectors 50a, linear thermal detector's 50b, or infra-red (IR)/optical sensors 50c located within the one or more hazard areas HA. Upon appropriate detection and determination of a fire in a hazard area, the central controller 12 signals for preferably automatic release of suppressant through the modules 14y of the release data bus 18. The release modules and/or relay modules 14y of the release data bus 18 interconnect the central controller 12 with one or more actuation assemblies 60 for the release of fire suppressant. The system 10 is preferably connected to a supply of suppressant such as for example, wet and/or dry chemical agent preferably stored in one or more storage tanks ST, for delivery to one or more nozzles or distribution devices 70 located in the hazard area HA. A cylinder of pressurizing gas PG is connected to a suppressant storage tank ST for delivering the suppressant to the nozzle 70 under its operating or working pressure. Controlling the release of the pressurizing gas PG into the suppressant tank ST is the preferably electrically operated actuation assembly 60, which is coupled to a module 14y of the release data bus 18. The modules 14z of the user interface bus 20 provide and interconnect user displays, controls and/or ports for users to access the system 10 to program system operations, manually signal operation of the system 10 and/or access history logs and other data on the system 10.

Figure 2A:
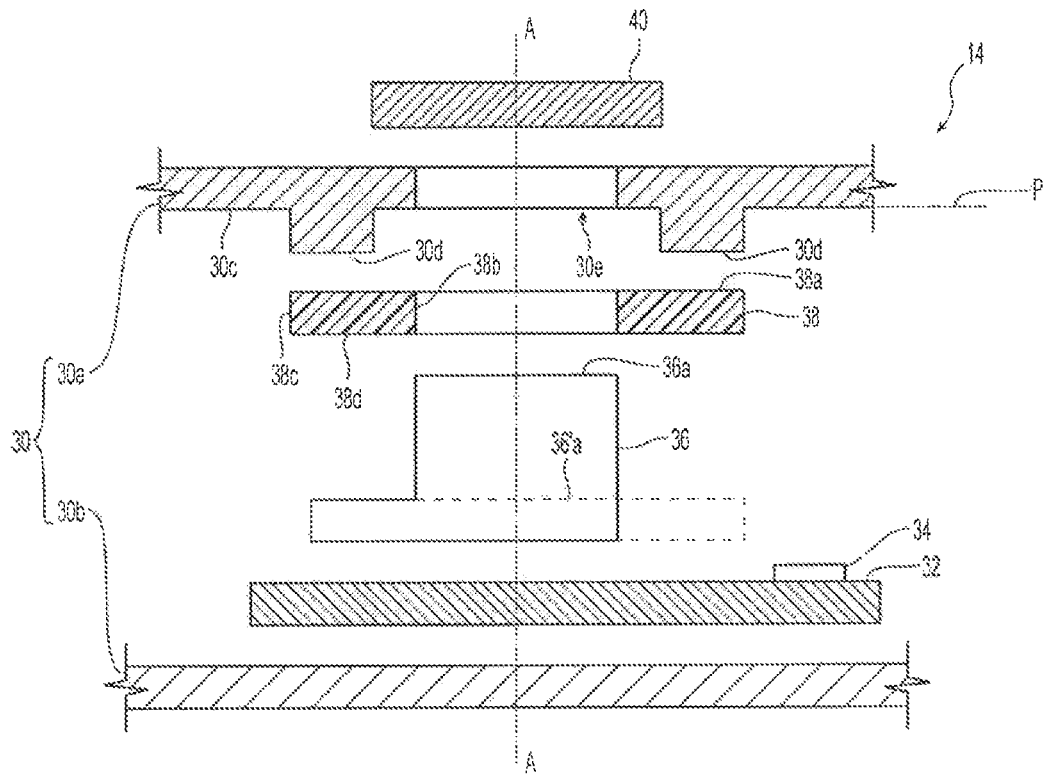
FIGS. 2A-2B are schematic exploded and assembled views of a preferred embodiment of a module for use in the system of FIG. 1.
Figure 2B:
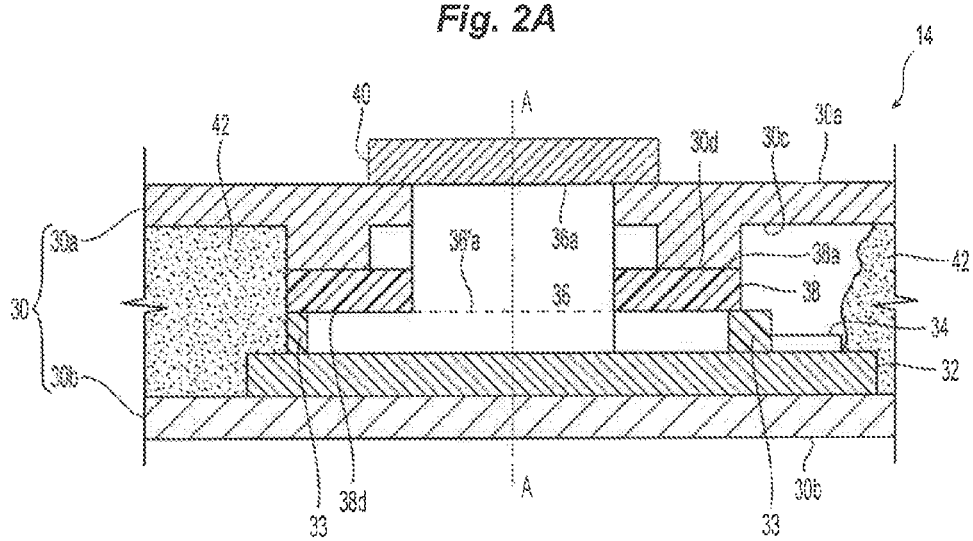

Shown in FIGS. 2A and 2B are respective schematic exploded and assembled views of a generalized module 14 representing the various modules 14x, 14y, 14z used in the system 10. The module 14 generally includes a housing 30, an internal printed circuit board (PCB) 32 with a microprocessor 34 mounted to the printed circuit board 32. Depending upon the type of module, the microprocessor 34 is connected or coupled with a component 36. The component 36 can be an internal or external fire detection or thermal sensor, an external transducer or other electrically operated device or other digital or analog equipment or alternatively can be connected to an Input or output device, such as for example, a liquid crystal display (LCD). The component 36 includes an operative surface 36a, for example, a surface for fire detection or a display surface for displaying information to a user. The preferred modules include a gasket member 38 disposed about the component 36 with a gasket face 38a to form a seal about the operative surface 36a. Preferred embodiments of the gasket member 38 are annular having an inner edge 38b and an outer edge 38c. The gasket member 38 preferably circumscribes the operative surface 36a and/or the component 36 itself. In some embodiments the inner edge 38b of the gasket member 38 substantially conforms to the peripheral edge of the component 36a. The gasket member 38 is preferably a closed cell foam or sponge rubber gasket.

In preferred embodiments of the module 14, the housing 30 includes an inner surface 30c forming a gasket contact surface 30d preferably circumscribed about the axis A-A for mating with the gasket face 38a of the gasket member 38. The housing 30 includes an opening 30e to frame the operative surface 36a of the component 36 to expose the operative surface 36a for its operative function, e.g., detection or display. The housing preferably includes a front or first housing segment 30a and a second or back housing segment 30b. The housing 30 and its surfaces are preferably formed, molded or stamped from an appropriate material, such as a plastic polymer material or alternatively from a metal or alloy. As shown, the gasket contact surface 30d preferably surrounds the opening 30e. The opening 30e is preferably covered by a protective transparent plate 40 to protect the component 36 and the other internal components of the module 14. The opening 30e of the housing defines a plane P across the face of the opening 30e. A preferred gasket contact surface 30d is also planar and preferably disposed parallel of the plane P. Moreover, in preferred embodiments of the module 14, the gasket contact surface 30d is preferably disposed outside the plane P. Depending upon the component 36, the gasket contact surface 30d and gasket member 38 can be located in various positions relative to the operative surface 36a to best expose the operative surface 36a to the opening 30e. For example, the gasket contact surface 30d can be disposed between the operative surface 36a and the gasket member 38. Alternatively, for an operative surface 36'a, the gasket member 38 is disposed between the gasket contact surface 30d and the operative surface 36'a. Preferably before locating the gasket member 38 about the operative surface 36a and/or the component 36 itself, an appropriate conformal coating 33, such as for example a conformal coating of a silicone resin solution is applied to surfaces of the operative component 36, around its operative surface 36'a and the surrounding PCB 32. The coating can protect the operative surfaces against moisture or other contaminants and moreover, provides a flat surface against which the gasket member 38 can seat and form a mating seal.

Shown in FIG. 2B is the assembled module 14. The gasket member 38 and its gasket face 38a mate with the gasket contact surface 30d of the housing 30 to form a first seal. An opposite surface 38d of the gasket member 38 preferably forms a mating seal with either the printed circuit board 32 or a portion of the component 36. Prior to securing the second housing segment 30b to the first housing segment 30a, a potting compound 42 fills the one or more voids about the internal components of the module 14. With the gasket member 38 mated in place, the component 36 and its operative surface 36a are sealed against contamination from the potting compound 42. The second housing segment 30b can be secured to the first housing segment 30a to form a seal therebetween and along any connectors or penetrations formed along the housing. Preferred embodiments of the modules 14 described herein are suitably sealed against dust, moisture and liquid to provide reliable module operation in dusty, moist, wet, and other extreme weather environments and/or environments subject to shock, vibration or other disturbances. More preferably, the modules 14 are sealed against dust, moisture, impact and shock to a preferred sealing rating or International Protection Rating (Ingress Progress Rating) of IP67 as defined in international standard IEC 60529 to classify the degree of protection of an enclosure against intrusion of solids and liquid. A summary of IP codes is provided at <http://www.dsmt.com/pdf/resources/iprating.pdf>. A rating of IP67 provides for protection "from total dust ingress" and protection from "immersion between 15 centimeters and 1 meter in depth."

Figure 3:
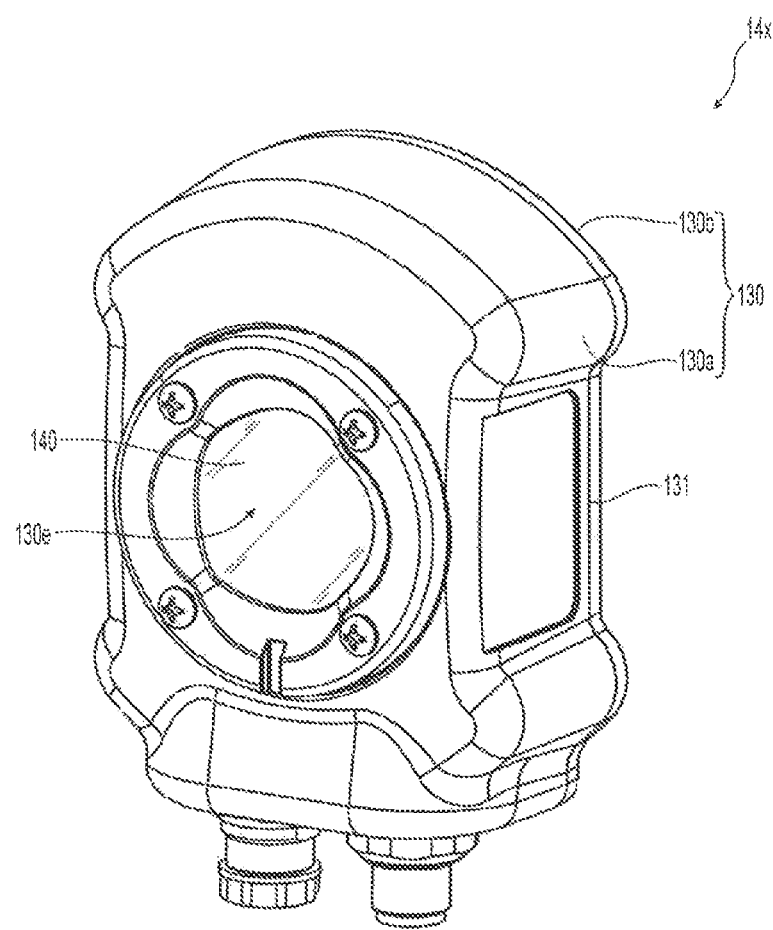
FIGS. 3-3C are perspective, exploded and cross-sectional views of various sections of a preferred embodiment of a detection module for use in the system of FIG. 1.
Figure 3B:
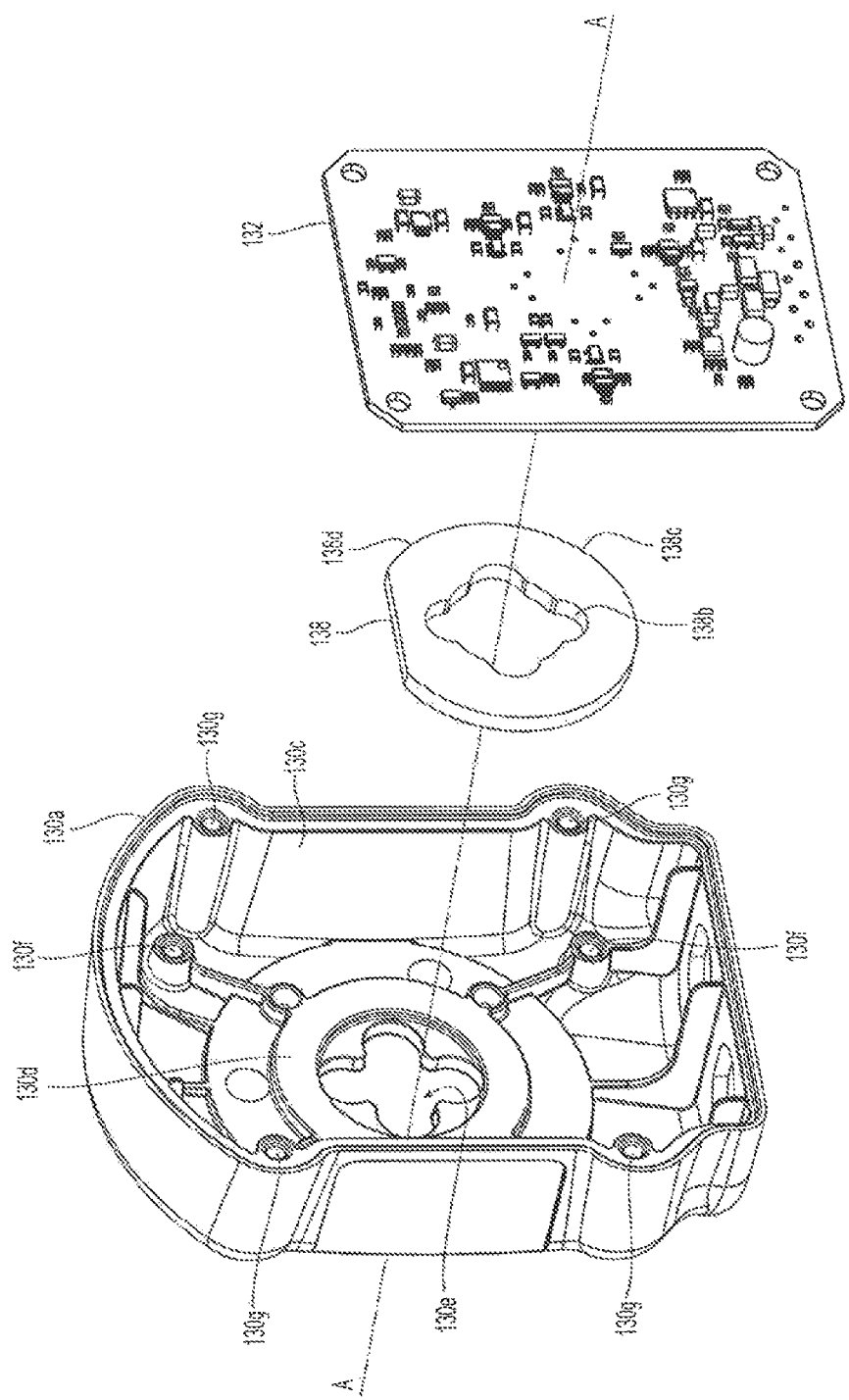
Figure 3C:
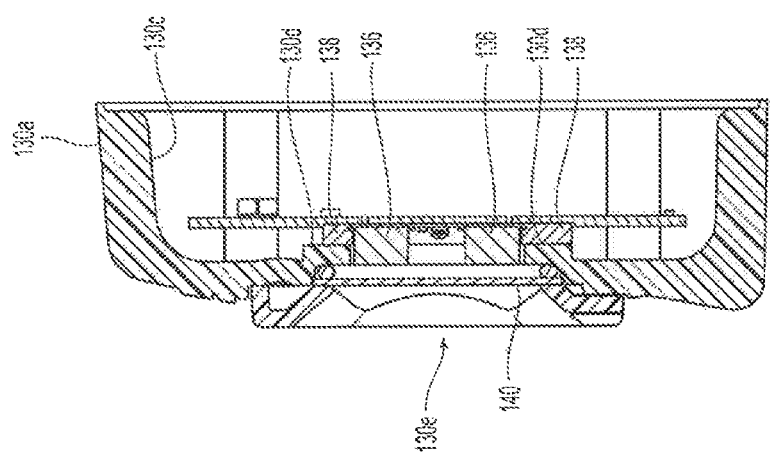

Shown in FIGS. 3-3C are various views of a preferred fire detection module 14x. The fire detection module 14x preferably includes a preferably plastic housing 130 having a first or front segment 130a and a second or back segment 130b with a preferably moisture and dust tight seal 131 therebetween. The front housing segment 130a includes an opening 130e covered by a protective transparent plate 140 preferably mounted to the first housing segment 130a. Shown in FIGS. 3A-3B are exploded views of the detection module 14x. Mounted to the PCB 132 are one or more thermopiles 136 coupled or connected to a microprocessor 134. Each of the thermopiles 136 has an operative surface 136a for detecting flame, heat, light, particulate, energy or other product/indicator of a fire. The thermopiles 136 preferably collectively define an outer contour 137. In a preferred embodiment, four thermopiles 136 are arranged next to one another in a diamond-like configuration. The thermopiles are substantially cylindrical with each having a height. The thermopiles 136 are preferably spaced apart at a distance less than their height. The opening 130e is preferably defined by tour overlapping circles sufficient to expose the operative surfaces 136a of the thermopiles 136 to detect a fire. A gasket member 138 is preferably disposed adjacent to the PCB 132 about the thermopiles. The gasket member 138 is preferably annular, having a gasket face 138a, an inner edge 138b, an outer edge 138c and an opposing surface 138d opposite the face 138a. The outer edge 138c is preferably substantially circular and can include one or more linear edges to provide for clearance from adjacent components, such as for example, the microprocessor 134. The inner edge 138b is formed to preferably conform to the outer geometry of the thermopiles 136. More preferably, the inner edge 138b is defined by a plurality of overlapping circles to define to the arcuate surfaces of the adjacent thermopiles 136.

Shown in FIG. 3B is the inner surface 130c of the first housing segment 130a. The inner surface 130c includes a preferably circular gasket contact surface 130d formed about the opening 130e. For the preferred module 14x, the inner surface 130c includes one or more mounting holes 130f, 130g to mount the PCB 132 and the second housing segment 130b. In the assembly of the detection module 14x, the PCB is mounted to compress the gasket member 138 against the contact surface 130d and form a seal to protect the operative surfaces 136a of the thermopiles located and exposed in the opening 130e. With the gasket and PCB in place, preferably with a conforming coating, a potting compound can be placed within the voids of the module to encapsulate the assembly. Once cured, the back housing component 130b can be mounted and secured to the front housing component to seal the module. Shown in FIG. 3C is an assembled cross-sectional view of the partially assembled detection module 14x.

Figure 4:
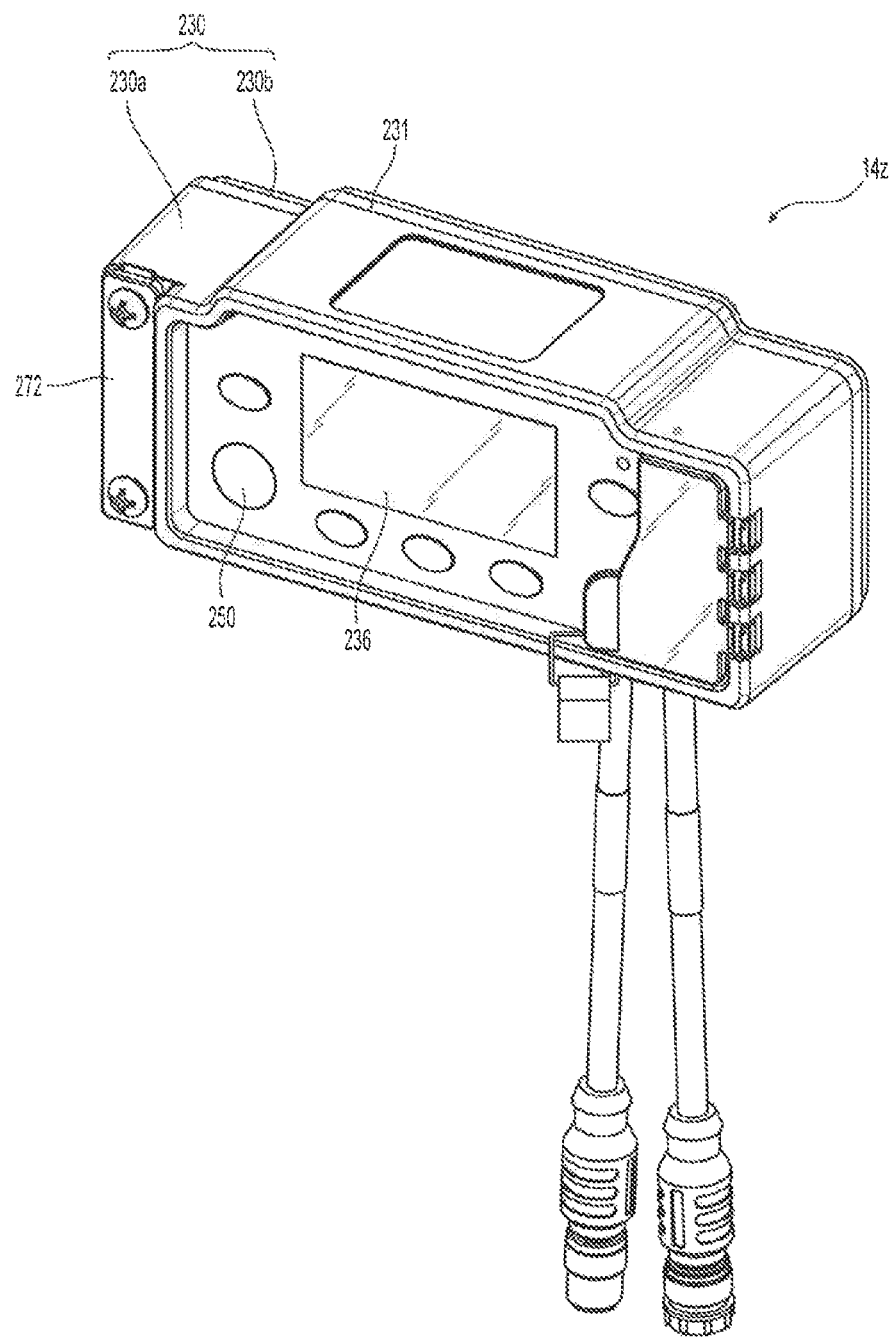
FIGS. 4-4D are perspective, exploded and cross-sectional views of various aspects of a preferred embodiment of a display module for use in the system of FIG. 1.
Figure 4A:
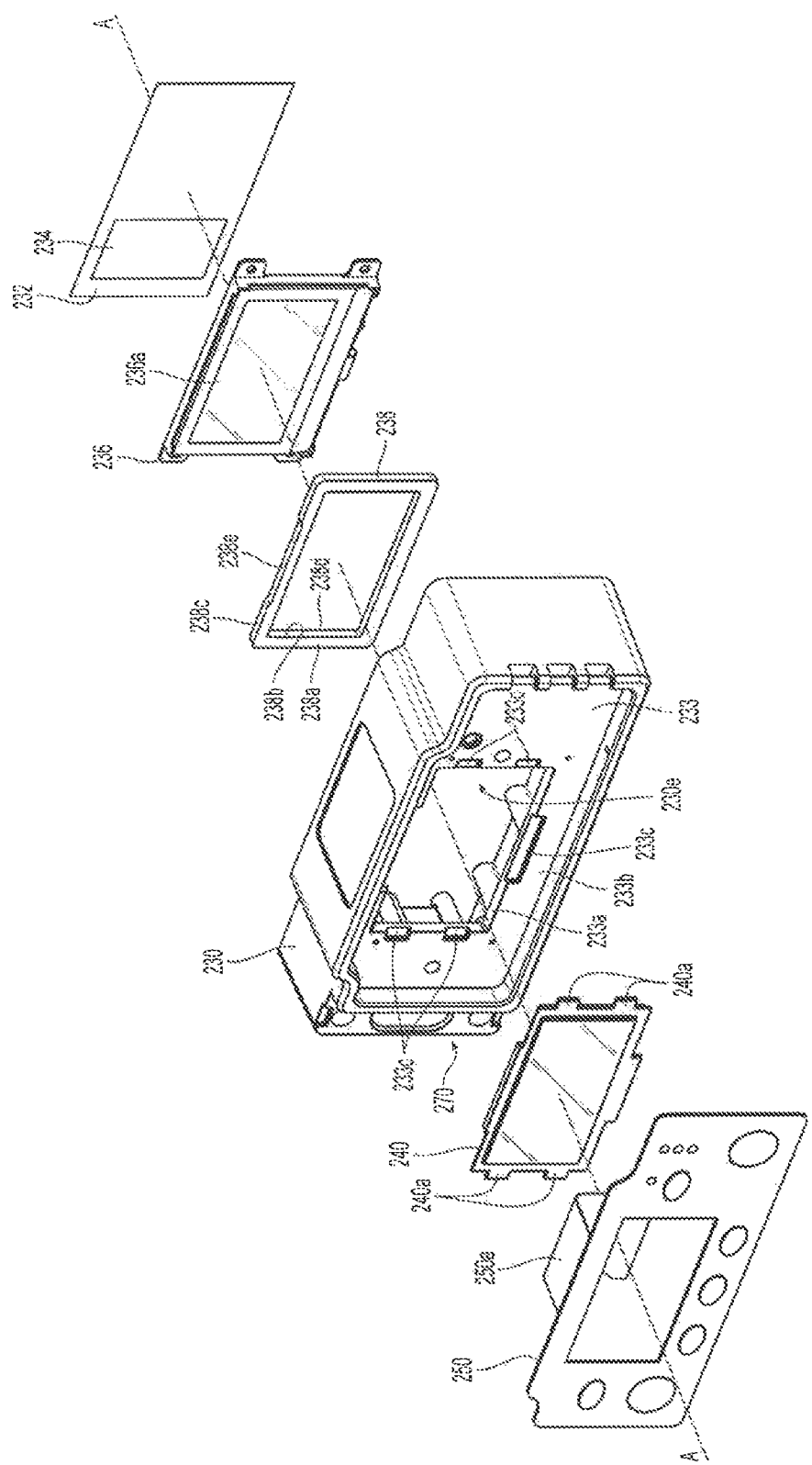
Figure 4B:
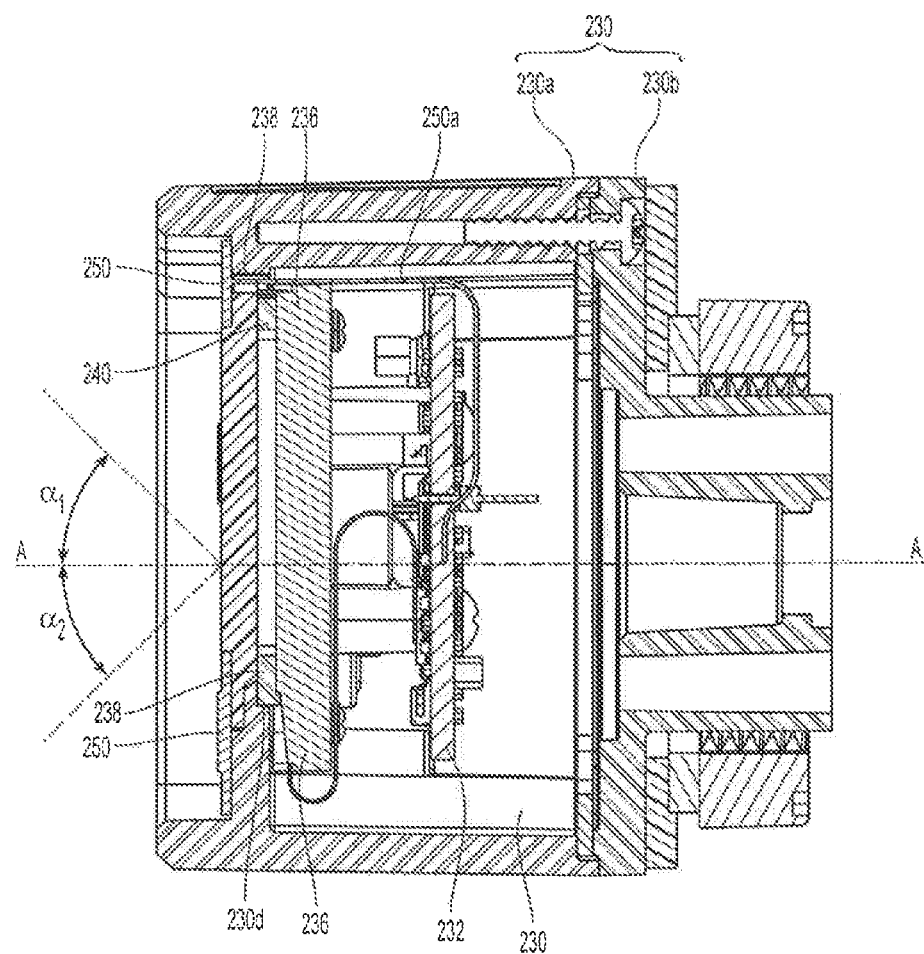
Figure 4C:
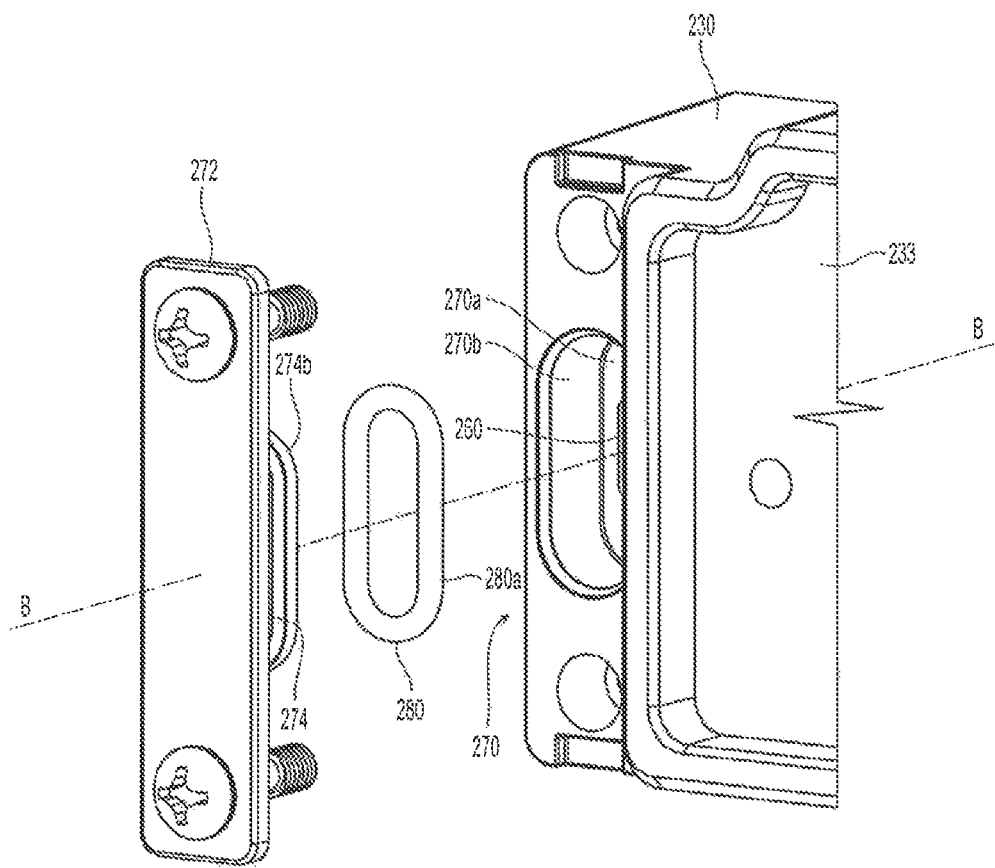

Shown in FIGS. 4-4C are various views of a preferred display module 14z. The display module 14z is preferably configured as a user input and output device that can access the central controller and display information to a system user or operator. The display module 14z also preferably provides an input interface for the system user or operator to selectively access, operate, and/or program all or part of the system 10 through the central controller 12. Accordingly, in a preferred aspect, the user display module 34z includes one or more display devices 80a such as, for example, a liquid crystal display (LCD) screen 236 mounted within the housing 230 of the display module 14z coupled to the internal microprocessor 234. A protective transparent plate 240 protects the LCD screen 236. The display module housing 230 preferably includes a front housing segment 230a and a back housing segment 230b with a sealed seam formed therebetween. Additionally or alternatively, the display module 14z can include an array of LED indicators coupled with the microprocessor 234. Also mounted about the module 14z are one or more control devices coupled with the microprocessor 234 to control the LCD 236 or other display device and access the central controller 12. The control devices preferably include push buttons, toggle buttons, scroll bars, touch screen and more preferably includes a membrane switch 250 coupled with the microprocessor 234. One preferred embodiment of the membrane switch includes up and down arrow buttons with one or more selection buttons for accessing, navigating and selecting through operational programs of the system 10 located on the central controller 12.

Shown in FIG. 4A is an exploded view of the display module 14z. Mounted to the PCB 232 is the LCD 236 having an operative surface or viewing area 236a. The LCD 236 and its viewing area 236a are shown being rectangular in shape, but other shapes are possible. The housing 230 and its first segment 230a preferably include an intermediate wall or plenum 233 for supporting each of a gasket member 238 and the preferred membrane switch 250. The gasket member 238 is preferably annular and rectangular having a gasket face 238a, an inner edge 238b, an outer edge 238c and an opposing surface 238d opposite the face 238a. In the module assembly, the gasket member 238 is disposed with the gasket surface 238d mated against the LCD. Accordingly, the inner edge 238b preferably defines a rectangular shape to outline and maximize the viewing area 236a of the LCD 236. The gasket face 238a mates with a gasket contact surface 230d of the housing 230 formed along a first side 233a of the plenum 233 about an opening 230e formed in the plenum.

The opening 230e is preferably rectangular and sufficiently large to expose the viewing area 236a of the LCD screen 236.

The plenum 233 is preferably located within the housing in order to recess the protective transparent plate 240 in the housing yet be sufficiently forward for the LCD screen 236 to remain visible to an operator at a reasonable distance. In one preferred aspect the LCD screen 236 preferably remains visible even when the protective plate is tilted at a maximum angle α of forty-five degrees (45°) off of the central axis A-A of the central module 14z. Moreover, the protective plate 240 is recessed to provide a flat surface over which the membrane switch is mounted. Formed about the opening 230e on a second surface 233b of the plenum 233 is a recess 233c for receiving at least a portion of the protective transparent plate. More preferably formed are two or more recesses 233c formed about the opening 230e. The protective transparent plate 240 includes a corresponding number of extensions or tabs 240a for receipt in the recesses 233c. With the tabs 240a seated in the recesses 233c, the protective plate 240 is positioned to present a surface flush with the second surface 233b against which the membrane switch can seat. With the membrane switch 250 properly seated against a flush or planar surface, the buttons of the membrane switch 250 can be depressed with a preferably consistent feel. Moreover, the membrane switch 250 can include a seal formed along its outer edges that forms a sealed engagement with the housing 230. The formed seal preferably satisfies an IP67 rating.

Shown in FIG. 4B is a cross-sectional view of the assembled display module 14x. For the preferred module 14x, an inner surface 230c includes one or more mounting holes to mount the PCB 132, the LCD 236 and the second housing segment 230b. In the assembly of the display module 14z, the PCB 232 is mounted to compress the gasket member 238 against the contact surface 230d and form a seal to protect the viewing surface 236a of the LCD screen 236, which is located and exposed in the opening 230e. For the preferred embodiments, the gasket member 238 is disposed between the gasket contact surface 230d and the LCD display 236. Alternatively, the gasket contact surface 230d is disposed between the viewing area 236a and the gasket member 238, As shown in FIGS. 4A and 4B, the membrane switch 250 includes a ribbon 250a to couple to a connector mounted on the PCB 232. The ribbon extends over the protective transparent plate 240, through the opening 230e, over the LCD screen and into the PCB 232. To facilitate the travel of the ribbon 250a, the gasket member 238 and its outer edge 238c includes a channel 238e to house the ribbon 250a. With the gasket and PCB in place, preferably with a conforming coating, a potting compound can be placed within the voids of the module to encapsulate the assembly. Once cured, the back housing component 230b can be mounted and secured to the front housing component to seal the module.

In another preferred aspect of the modules, such as for example, the display module 14z, the module includes a digital access connector 260 for access by a computer device or computer storage device, such as for example, a thumb drive. In one preferred embodiment, the digital access connector is embodied as a USB or similar post connection, A system user or operator could access the port 260 with a computer or disc drive using an appropriately configured connector to download or access system history logs and system programming, to update system programming or to upload new programming to the central controller 12. When not being accessed, it is desirable to cover and house the port 260 to seal out the port 260 from liquid, dust and moisture, preferably to a rating of IP67.

Shown in FIGS. 4A and 4C, the display module includes the port 260 disposed within a chamber 270 formed within or integrated into the housing 230. The chamber 270 includes a chamber floor 270a and an internal chamber wall 270b. The port 260 is preferably disposed along and centered along the chamber floor 270a to interface the computer device. More preferably, the port 260 is recessed in the floor 270a. As seen in FIG. 4C, a cover plate 272 is to be secured to the housing for covering the chamber 270 when the port 260 is not in use. The cover plate 272 can be fastened by screws, clamps or any other mechanical mechanisms for sealing the chamber 270 in a manner described herein. A preferred cover plate 272 includes a post 274 having a first end 274a centered on the cover plate 272 and a second end 274b with a neck portion 274e formed between the first and second ends 274a, 274b.

Figure 4D:
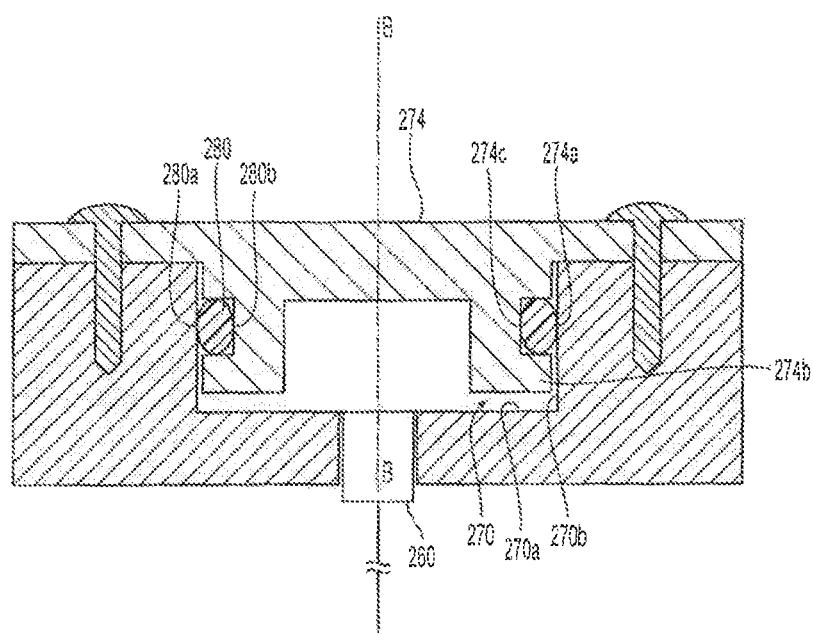

As shown in FIG. 4D, with the cover plate 272 secured to the housing 230 over the chamber 270, the post 274 is disposed in the chamber 270 and preferably with the second end 274b of the post 274 disposed over the port 260. A gasket 280 is preferably disposed about the neck portion 274c to form a seal with the chamber wall 270b. In a preferred embodiment, the gasket member 280 has an outer surface 280a circumscribed about the post 274 that forms a sealed contact with the chamber wall 274b circumscribed about or surrounding the post 274. The formed seal is sufficient to keep liquid, moisture, dust and/or particulate out of the port 260. The seal preferably has an IP67 rating.

As shown in FIGS. 4C and 4D, the chamber 270 and its inner wall 270b are preferably elongated and in plan view, more preferably form an oval shaped enclosure or perimeter about the post 274. The post 274 is formed to be concentric within the chamber 270. Accordingly, in a preferred embodiment, the post 274 forms an elongated oval from its end view. The gasket 280 can be a standard off the shelf o-ring gasket or seal that can be stretched over the outer surface of the neck portion 274c of the post 274. Each of the first and second ends 274a, 274b of the post 274 preferably includes or forms a lip or edge to retain the gasket member on the neck 274c. With reference to FIG. 4D, the post 274 has a preferred axial length that is smaller than the depth of the chamber 270 so that the second end 274b of the post 274 can be spaced and located above the post 260 when the cover plate 272 is secured in place.

Referring to FIG. 1, the system 10 and its modules 14x, 14y, 14z and components are preferably powered through the central controller 12 and the data buses 16, 18, 20. A power bus 22 is preferably initiated at the centralized controller 12 for distribution to the various modules and associated components to power the system 10. A power module 100 is preferably interconnected with the central controller 12 to power the data buses. In order to supply power to the power module 100, the power module is preferably coupled to battery power, such as for example in the case of mobile equipment, a vehicle battery VBATT to power the system 50.

Figure 5:
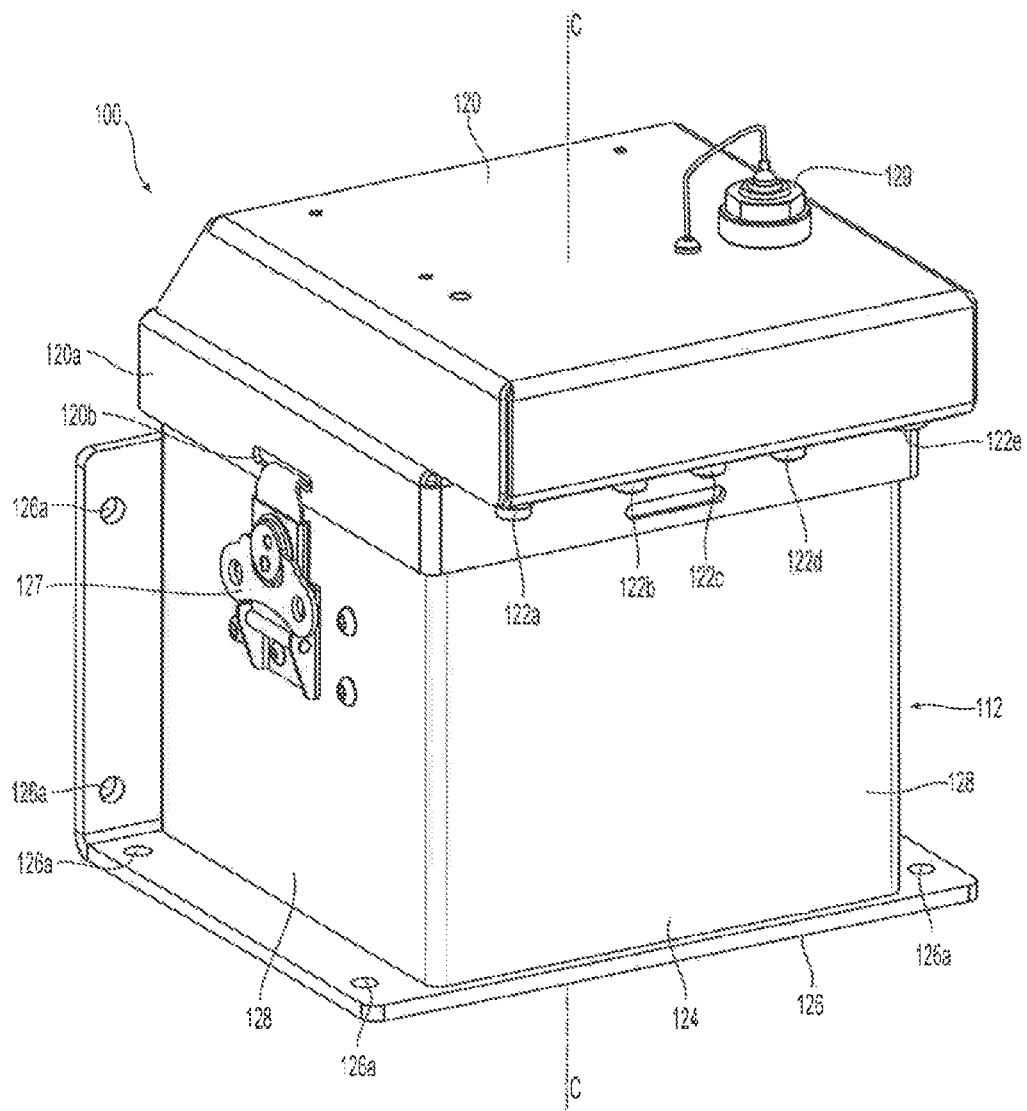
FIGS. 5-5B are perspective, exploded and schematic views of a preferred embodiment of a power module and portions thereof for use in the system of FIG. 1.

Shown in FIG. 5 is a preferred integrated controller and battery back-up power module 100 for powering the system 10. The power module includes a case 120 for housing the central controller 12 therein. The module 100 includes two or more connectors 122 wired to the central controller for connection to an external power source, external devices and the plurality of modules making up the system 10, such as for example, the preferred detection modules, display modules and other related modules such as release or relay modules of the system. The connectors 122 can be fixed to the controller casing 120. Moreover, the connectors can be of any form to facilitate connection of power wires and/or data communication wires. Preferably, the connectors 122 are female or male deutsch connectors for interconnection with correspondingly compatible connectors carrying either data or power. More preferably, a connector 122a is a deutsch connector or quick connector for connection to power carrying cable. Connectors 122b, 122c, 122d are preferably circular pin connectors configured for interconnection with data carrying cables to carry data to and fro between the central controller 12 and the modules of the system over the data buses 16, 18, 20 as schematically shown in FIG. 1.

Figure 5A:
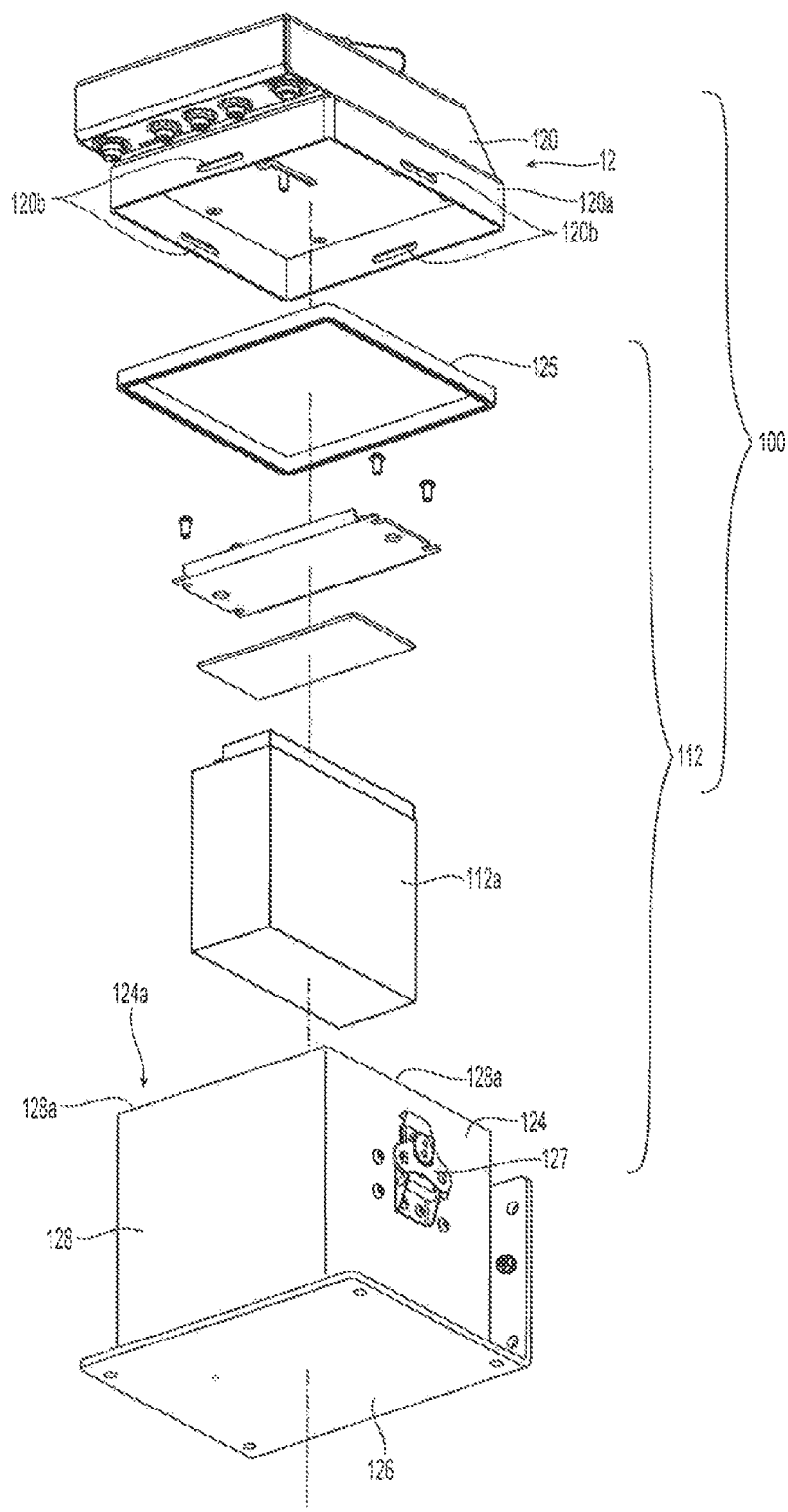

Referring to FIGS. 5 and 5A, the module 100 includes a battery back-up 112 coupled to the controller 12 and its case 120. The battery back-up 112 includes a housing 124 with at least one battery 112a disposed therein. Preferably, the module 100 is sized to house as many as two batteries 112a. The batteries 112a are of a suitable voltage and sufficiently or exceedingly durable to operate in the temperatures and vibratory conditions that are anticipated in the system operational environment. Exemplary batteries can include the batteries shown and described in Tyco Fire Protection Products publication. S2081-0006-20, "SIMPLEX®: Fire Alarm Control Panel Accessories" (January 2012) available at <https://www.tycosimplexgrinnell.com/wps/wcm/connect/2e68e12-35-eb-48c4-9b65-6e2cad9a27b6/System+Batteries,+Sealed+Lead-Acid,+Cabinet+Mount.pdf?MOD=AJPERES&CACHEID=2ae68e12-35eb-48c4-9b65-6e2cad9a27b6>. The housing 124 has a base 126 with a wall enclosure 128 extending from the base 126 along a central axis C-C to define the housing 124 with an open top 124a. The wall 128 can be a single wall formed about the base 126 or alternatively can be individual walls or panels extending from the base to define the enclosure of the housing 124. Accordingly, the wall(s) 128 can define any geometry for the enclosure, such as for example, cylindrical. Preferably the housing is a rectangular prism or cube. The walls 128 preferably extend from the base 126 to form an edge 128a circumscribed about the central axis A-A to define the opening 124a. Preferably disposed over the edge 128a is a gasket member 125. The gasket member is preferably molded to fit over the edge 128a and is preferably made of rubber, plastic or any suitable material for forming a fluid or dust tight seal as described herein. In the power module assembly, the central controller case 120 is disposed over the opening to form a seal and enclose the housing 124. More particularly, the case 120 preferably includes a lip 120a that is sized and shaped to slide over the gasket member 125 so as to compress the gasket 125 so as to form a fluid tight seal with the outer edges of the housing wall(s) 128 and the inner surface of the tip 120a. The formed seal is preferably liquid, moisture, and/or dust tight and more preferably satisfies a sealing rating of IP67.

To secure the controller case 120 to the housing 124 and form the seal, the module 100 preferably includes two or more latches 127 to clamp the case 112 to the housing 124 over the opening and form the preferred seal. As shown in FIGS. 5 and 5A, the housing includes a pair of cam latches 127 disposed about the housing 124. The case 120 includes two or more slots 120b spaced about the lip or ledge 120a of the case. The latches 127 engage the slots 120b to secure the case 120 to the housing 124. In addition to maintaining the preferred seal, the latches 127 also preferably secure the case 120 and the housing 124 to resist shock and vibration.

With multiple slots 120b preferably disposed about the case 120, the case 120 can be disposed in multiple orientations about the central axis C-C of the housing 124. Moreover, the engagement of the case 120 and the housing 124 provides that the portion of the case 120 with the connectors overhangs the housing 124. With the connectors 122 disposed along the underside of the overhang, the overhang provides an additional shield to protect the connectors from moisture and debris. The latch and slot engagement allows the connectors to be positioned in any manner about the central axis C-C to facilitate system installation. The base 126 preferably includes mounting flanges with mounting holes 126a arranged parallel and perpendicular to the central axis C-C to allow the module 100 to be mounted with the central axis in a horizontal or vertical orientation.

The preferred power module 100 also facilitates maintenance of the system 10. More specifically, an isolation switch 129 is preferably disposed on an upper surface of the module 100. With reference to FIG. 1, the isolation switch 129 is preferably lockable with a customized key 129a. Insertion of the key 129a into a receptacle or receiver of the switch 129 preferably generates a signal which in turn disables the automatic suppressant release capability of the system. By disabling the automatic release, maintenance about the equipment and system service can be conducted without worry of an unwanted automatic release. The key 129a is preferably customized to limit personnel being able to disable the automatic release. The isolation switch 129 is also sealed in a manner consistent with the rest of the system. More preferably, the isolation switch is secured in a scalable bung to keep out moisture, liquid, dust and/or particulate. More preferably, the isolation switch is sealed to a preferred rating of IP67.

As schematically shown in FIG. 1, the power module 100 and the rest of the system 10 is powered, for example, by the main vehicle battery VBATT. Shown in FIG. 5B is a preferred connector 300 for connecting the vehicle battery VBATT to the central controller 12 and the power module 100. The connector includes a first segment 302 having a pair of ring terminals 302a for connection to the vehicle battery VBATT. An intermediate connector 302b provides for connection to a fuse for fuse protection. A second segment 304 is preferably directly wired to the central controller 12. Each of the first and second segments 302, 304 is connected by complementary connectors 122am, 122af of the preferred quick or deutsch connector 122a.

While the present invention has been disclosed with reference to certain embodiments, numerous modifications, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

We claim:

1. A fire suppression system comprising:
   a centralized controller; and
   a plurality of modules interconnected with the centralized controller, the plurality of modules including at least one module having:
   a housing;
   a printed circuit board disposed within the housing;
   a microprocessor mounted to the printed circuit board;
   a plurality of thermopiles for detecting a fire coupled to the microprocessor, at least one of the thermopiles having an operative surface; and a gasket member disposed about the plurality of thermopiles and having a gasket face to form a seal about the operative surface, wherein the gasket member has an outer edge and an inner edge, and wherein the inner edge mates with an outer surface of at least one of the thermopiles.

2. The system of claim 1, wherein the housing has an inner surface forming a gasket contact surface, the gasket face mating with the gasket contact surface to form the seal.

3. The system of claim 2, wherein the housing includes an opening to frame the operative surface of the component, the gasket contact surface surrounding the opening.

4. The system of claim 3, wherein the opening is covered by a protective transparent plate.

5. The system of claim 3, wherein the opening defines a plane and the gasket contact surface is planar and parallel to the plane.

6. The system of claim 5, wherein the gasket contact surface is disposed out of the plane.

7. The system of claim 2, wherein the gasket contact surface is disposed between the operative surface and the gasket member, the gasket member being disposed over a flat surface formed by a conformal coating.

8. The system of claim 2, wherein the gasket member is disposed between the gasket contact surface and the operative surface.

9. The system of claim 1, wherein the plurality of thermopiles collectively define an outer contour, and wherein the inner edge of the gasket member follows the outer contour.

10. The system of claim 9, wherein the plurality of thermopiles includes four thermopiles each having a height and being spaced apart from one another at a spacing distance less than the thermopile height.

11. The system of claim 1, wherein the plurality of thermopiles includes four cylindrical thermopiles, the inner edge of the gasket member defined by four overlapping circles to mate with the outer surfaces of each of the thermopiles.

12. The system of claim 1, wherein the inner edge mates with an outer surface of each of the thermopiles.

13. A fire suppression system comprising:
a centralized controller; and
at least one module interconnected with the centralized controller including:
    a housing having a chamber defined therein including a chamber floor and a chamber wall;
    a port disposed along the chamber floor to interface a computer device;
    a cover plate secured to the housing for covering the chamber;
    a post having a first end centered on the cover plate and a second end with a neck formed between the first and second end, the post being disposed in the chamber with the second end of the post disposed over the port; and
    a gasket disposed about the neck portion, the gasket forming a seal with the chamber wall.

14. A fire suppression system comprising:
a centralized controller; and
a plurality of modules interconnected with the centralized controller, the plurality of modules including at least one display module comprising:
    a housing including a wall, the wall including (a) a first surface, (b) a second surface opposite the first surface, and (c) an opening;
    a printed circuit board disposed within the housing;
    a microprocessor mounted to the printed circuit board;
    a display screen coupled to the microprocessor, the display screen having a defined viewing area to provide a display output to a user;
    a gasket member disposed about the display and having a gasket face to form a seal about the defined viewing area;
    a protective transparent plate covering the opening; and
    a membrane switch coupled to the microprocessor and disposed on the second surface of the wall,
    wherein the first surface of the wall defines a gasket contact surface for mating with the gasket face.

15. The system of claim 14, wherein the display screen is a liquid crystal display (LCD) screen.

16. The system of claim 14, wherein the gasket member has an outer edge and an inner edge to frame the viewing area.

17. The system of claim 16, wherein the inner edge defines a rectangle, and the gasket member includes a surface opposite the gasket face for mating with the display screen.

18. The system of claim 14, wherein the second surface includes a recess formed about the opening for receiving at least a portion of the protective transparent plate.

19. The system of claim 18, wherein the protective transparent plate includes a plurality of tabs spaced about a perimeter of the protective transparent plate, the second surface having a plurality of recesses formed about the opening for receipt of the tabs such that the protective transparent plate and the second surface define a common plane to support the membrane switch.

\* \* \* \* \*